(12) United States Patent
Sushihara et al.

(10) Patent No.: US 6,707,413 B2
(45) Date of Patent: Mar. 16, 2004

(54) A/D CONVERTER

(75) Inventors: Koji Sushihara, Osaka (JP); Akira Matsuzawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 10/234,596

(22) Filed: Sep. 4, 2002

(65) Prior Publication Data

US 2003/0048213 A1 Mar. 13, 2003

(30) Foreign Application Priority Data

Sep. 4, 2001 (JP) ........................................ 2001-266964

(51) Int. Cl.$^7$ ................................................ H03M 1/36
(52) U.S. Cl. ........................................................ 341/159
(58) Field of Search .................................... 341/159, 155, 341/136

(56) References Cited

U.S. PATENT DOCUMENTS 5,327,131 A * 7/1994 Ueno et al. ................. 341/136

FOREIGN PATENT DOCUMENTS

JP 04-043718 2/1992

OTHER PUBLICATIONS

"A 10 b, 20 Msample/s, 35 mW Pipeline A/D Converter", by T. Cho and P. Gray, IEEE Journal of Solid–State Circuits, vol. 30, No. 3, Mar. 1995, pp. 166–172.

* cited by examiner

Primary Examiner—Brian Young
(74) Attorney, Agent, or Firm—Snell & Wilmer, LLP

(57) ABSTRACT

An A/D converter of the present invention includes: a reference voltage generation section for generating a plurality of reference voltages; a differential amplification section for amplifying a voltage difference between each of the plurality of reference voltages and an input signal voltage so as to generate a plurality of output voltage sets, each of the plurality of output voltage sets including complementary non-inverted and inverted output voltages; and an operating section for receiving the plurality of output voltage sets, the operating section being operated according to a clock signal.

10 Claims, 12 Drawing Sheets

A/D CONVERTER

BACKGROUND OF THE INVENTION

1. Field of the Invention

The present invention relates to an A/D converter for converting an analog signal into a digital signal, and more particularly to a parallel-type A/D converter.

2. Description of the Related Art

FIG. 10 is a diagram showing a structure of a conventional parallel-type A/D converter 800. This conventional A/D converter 800 is used for performing high-speed analog-digital conversion.

The conventional A/D converter 800 includes a reference voltage generator circuit 801, a differential amplifier array 802, a comparator circuit array 803, and an encoder circuit 805. The reference voltage generator circuit 801 uses a plurality of resistors $R_1$–$R_n$ for dividing a voltage, which is applied between terminals to which a top level reference voltage 801a and a bottom level reference voltage 801b are applied, so as to generate reference voltages $VR_1$–$VR_{n+1}$. The reference voltages $VR_1$–$VR_{n+1}$ are input to the differential amplifier array 802. The comparator circuit array 803 compares the reference voltages $VR_1$–$VR_{n+1}$ with an analog signal voltage input via an analog signal voltage input terminal 804 in a parallel manner. The encoder circuit 805 performs logic processing (conversion) on comparison results output by the comparator circuit array 803 so as to output a digital data signal having a prescribed resolution.

A conventional A/D converter, such as the A/D converter 800 having the above-described parallel structure, has an advantage of performing high-speed A/D conversion as compared to other conventional A/D converters of various types, such as integrating-types, series-parallel types, etc. However, there is a disadvantage of the conventional A/D converter in that as resolving power thereof is increased, the number of differential amplifiers and comparator circuits included in the conventional A/D converter is required to be increased, and therefore power consumption and an area occupied by the differential amplifiers and the comparator circuits are increased.

Japanese Laid-Open Patent Publication No. 4-43718 discloses another conventional A/D converter 900 which is improved so as to overcome the above-described disadvantage.

FIG. 11 is a diagram showing a structure of the improved conventional parallel-type A/D converter 900. The A/D converter 900 includes a reference voltage generator circuit 911, a differential amplifier array 912, an interpolation resistor array 916, a comparator circuit array 903, and an encoder circuit 905. In the A/D converter 900, the comparator circuit array 903 and the encoder circuit 905 have the same structure as corresponding elements of the A/D converter 800 of FIG. 10. However, the A/D converter 900 is different from the A/D converter 800 in that the number of resistors included in the reference voltage generator circuit 911 is less than the number of those included in the reference voltage generator circuit 801, the number of differential amplifiers included in the differential amplifier array 912 is less than the number of those included in the differential amplifier array 802 and the interpolation resistor array 916 is further included.

Specifically, the reference voltage generator circuit 911 uses m number of resistors $R_1$–$R_m$, which is less than the number required in accordance with the resolving power of the A/D converter 900, for dividing a voltage, which is applied between terminals to which a top level reference voltage 911a and a bottom level reference voltage 911b are applied, so as to generate reference voltages $VR_1$–$VR_{m+1}$.

The differential amplifier array 912 uses m+1 differential amplifiers for amplifying voltage differences between each of the reference voltages $VR_1$–$VR_{m+1}$ and an input analog signal voltage input via an analog signal voltage input terminal 904, so as to output differential output voltages (non-inverted output voltages and inverted output voltages).

The interpolation resistor array 916 includes a plurality of resistors and divides a voltage, which is applied between terminals of two adjacent differential amplifiers to which non-inverted output voltages are applied, and a voltage, which is applied between terminals of two adjacent differential amplifiers to which inverted output voltages are applied, so as to be interpolated. Each of interpolated voltages derived from the non-inverted output voltages is compared with a corresponding one of interpolated voltages derived from the inverted output voltages by a corresponding comparator circuit included in the comparator circuit array 903. The comparison results are converted into a digital code by the encoder circuit 905 so as to output a digital data signal.

In the A/D converter 900, the voltage differences between each of the reference voltages $VR_1$–$VR_{m+1}$ and the analog signal voltage are amplified by multiplying the voltage differences by a gain of the differential amplifier array 912. Further, each comparator circuit included in the comparator circuit array 903 performs voltage comparison on corresponding output voltages of two adjacent differential amplifiers, which are interpolated by the interpolation resistor array 916, and therefore the number of differential amplifiers can be reduced to 1/x, where x is the number of interpolated bits, as compared to the case where the interpolation processing is not performed. Therefore, it is possible to reduce the power consumption and area occupied by the differential amplifiers to some extent.

A comparator circuit which can be used in both the A/D converter 800 of FIG. 10 and the A/D converter 900 of FIG. 11 is shown in FIG. 12.

FIG. 12 is a circuit diagram of a comparator circuit 850 for use in a conventional A/D converter.

The comparator circuit 850 compares voltage Vo applied to a gate of an NMOS transistor m1 with voltage Vob applied to a gate of an NMOS transistor m2.

When Vo>Vob, a drain current (Id1) of the NMOS transistor m1 is greater than a drain current (Id2) of the NMOS transistor m2. In this case, output voltages of the comparator circuit 850 are determined by load resistance (RL) and the drain currents (Id1 and Id2). The relationship between the determined output voltages of the comparator circuit 850 is represented by Q (=VDD−Id1·RL)<QB(=VDD−Id2·RL).

When Vo<Vob, the drain current (Id2) of the NMOS transistor m2 is greater than the drain current (Id1) of the NMOS transistor m1. The relationship between the output voltages of the comparator circuit 850 is represented by Q>QB.

However, even in the case where an A/D converter is configured so as to use the interpolation resistors for interpolating and comparing voltages amplified by the differential amplifiers in the above-described manner, the number of comparator circuits included in the A/D converter is required to comply with the requirements of the resolving power of the A/D converter. Specifically, $2^{n-1}$ comparator circuits are required when the A/D converter outputs an n-bit digital code. Therefore, the A/D converter has a problem that as the resolving power of the A/D converter is increased, the number of comparator circuits included in the A/D converter is considerably increased, thereby increasing power consumption of the A/D converter.

One of techniques of reducing power consumption of a comparator circuit itself is known from Thomas Byunghak Cho, "A 10 b, 20 Msample/s, 35 mW Pipeline A/D Converter", IEEE JOURNAL OF SOLID-STATE CIRCUITS, VOL. 30, NO. 3, MARCH 1995, pp. 166–172. This publication describes that dynamic comparator circuits are used in a low-resolution A/D conversion section which is provided in each pipeline stage of a pipeline A/D converter, instead of using high-speed and highly-responsive constant current-type comparator circuits for use in a typical A/D converter. Since the dynamic comparator circuit does not require a constant current, the power consumption is considerably reduced in comparison with the case where the constant current-type comparator circuit is used.

However, there is a problem that the above-described dynamic comparator circuit can be used only in a low-resolution A/D converter, since the influence of offset on such an A/D converter is so great as to deteriorate comparison precision. Further, in order to use the dynamic comparator circuit in an A/D converter having relatively-high resolving power, error correction processing is required to be performed. Additional circuitry is required to perform the error correction processing, and the power consumption and a circuit area, which would be increased by the provision of the additional circuitry, are not negligible.

SUMMARY OF THE INVENTION

According to one aspect of the present invention, there is provided an A/D converter which includes: a reference voltage generation section for generating a plurality of reference voltages; a differential amplification section for amplifying a voltage difference between each of the plurality of reference voltages and an input signal voltage so as to generate a plurality of output voltage sets, each of the plurality of output voltage sets including complementary non-inverted and inverted output voltages; and an operating section for receiving the plurality of output voltage sets, the operating section being operated according to a clock signal, in which the operating section includes a comparison section having a threshold voltage Vtn, the comparison section includes an input transistor section to which first and second output voltage sets of the plurality of output voltage sets are input, and a positive-feedback section operating according to the clock signal, the first output voltage set includes a first non-inverted output voltage and a first inverted output voltage, and the second output voltage set includes a second non-inverted output voltage and a second inverted output voltage, the input transistor section performs a prescribed weighting calculation so as to determine the threshold voltage Vtn, and compares a difference between the first non-inverted output voltage and the first inverted output voltage with a difference between the second non-inverted output voltage and the second inverted output voltage so as to output a comparison result to the positive-feedback section, and the positive-feedback section amplifies the comparison result output by the input transistor section when the clock signal is at a prescribed level and retains the amplified comparison result while outputting the amplified comparison result as a digital signal.

In one embodiment of the invention, the A/D converter further includes an encoding section for encoding the digital signal.

In another embodiment of the invention, the A/D converter further includes a first interpolation section for interpolating the first and second non-inverting output voltages and a second interpolation section for interpolating the first and second inverted output voltages.

In still another embodiment of the invention, the A/D converter further includes an input signal voltage level detection section for detecting the input signal voltage so as to control the operating section according to a level of the input signal voltage.

In still another embodiment of the invention, the input transistor section includes a plurality of transistors and the weighting calculation is performed by changing respective sizes of the plurality of transistors.

In still another embodiment of the invention, the operating section includes $2^n$ comparison sections, where n is an integer.

In still another embodiment of the invention, the plurality of transistors are provided so as to form respective prescribed transistor patterns, and dummy transistor patterns are provided at opposite ends of a series of the transistor patterns.

In still another embodiment of the invention, the plurality of transistors are provided so as to form respective prescribed transistor patterns, and the series of the transistor patterns is linearly-symmetrical with respect to a center line of the input transistor section.

In still another embodiment of the invention, the reference voltage generation section, the differential amplification section, and the operating section are formed on a single chip.

Another aspect of the present invention, there is provided a system which includes: a clock signal generation section for generating a clock signal having a variable frequency; and an A/D converter to which the clock signal generation section is connected, the A/D converter including: a reference voltage generation section for generating a plurality of reference voltages; a differential amplification section for amplifying a voltage difference between each of the plurality of reference voltages and an input signal voltage so as to generate a plurality of output voltage sets, each of the plurality of output voltage sets including complementary non-inverted and inverted output voltages; and an operating section for receiving the plurality of output voltage sets, the operating section being operated according to the clock signal, in which the operating section includes a comparison section having a threshold voltage Vtn, the comparison section includes an input transistor section to which first and second output voltage sets of the plurality of output voltage sets are input, and a positive-feedback section operating according to the clock signal, the first output voltage set includes a first non-inverted output voltage and a first inverted output voltage, and the second output voltage set includes a second non-inverted output voltage and a second inverted output voltage, the input transistor section performs a prescribed weighting calculation so as to determine the threshold voltage Vtn, and compares a difference between the first non-inverted output voltage and the first inverted output voltage with a difference between the second non-inverted output voltage and the second inverted output voltage so as to output a comparison result to the positive-feedback section, and the positive-feedback section amplifies the comparison result output by the input transistor section when the clock signal is at a prescribed level and retains the amplified comparison result while outputting the amplified comparison result as a digital signal.

Thus, the invention described herein makes possible the advantages of providing a high-speed and high-precision A/D converter which realizes low power consumption.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of a parallel-type A/D converter according to the present invention are described in detail with reference to the drawings.
(Embodiment 1)

Figure 1:
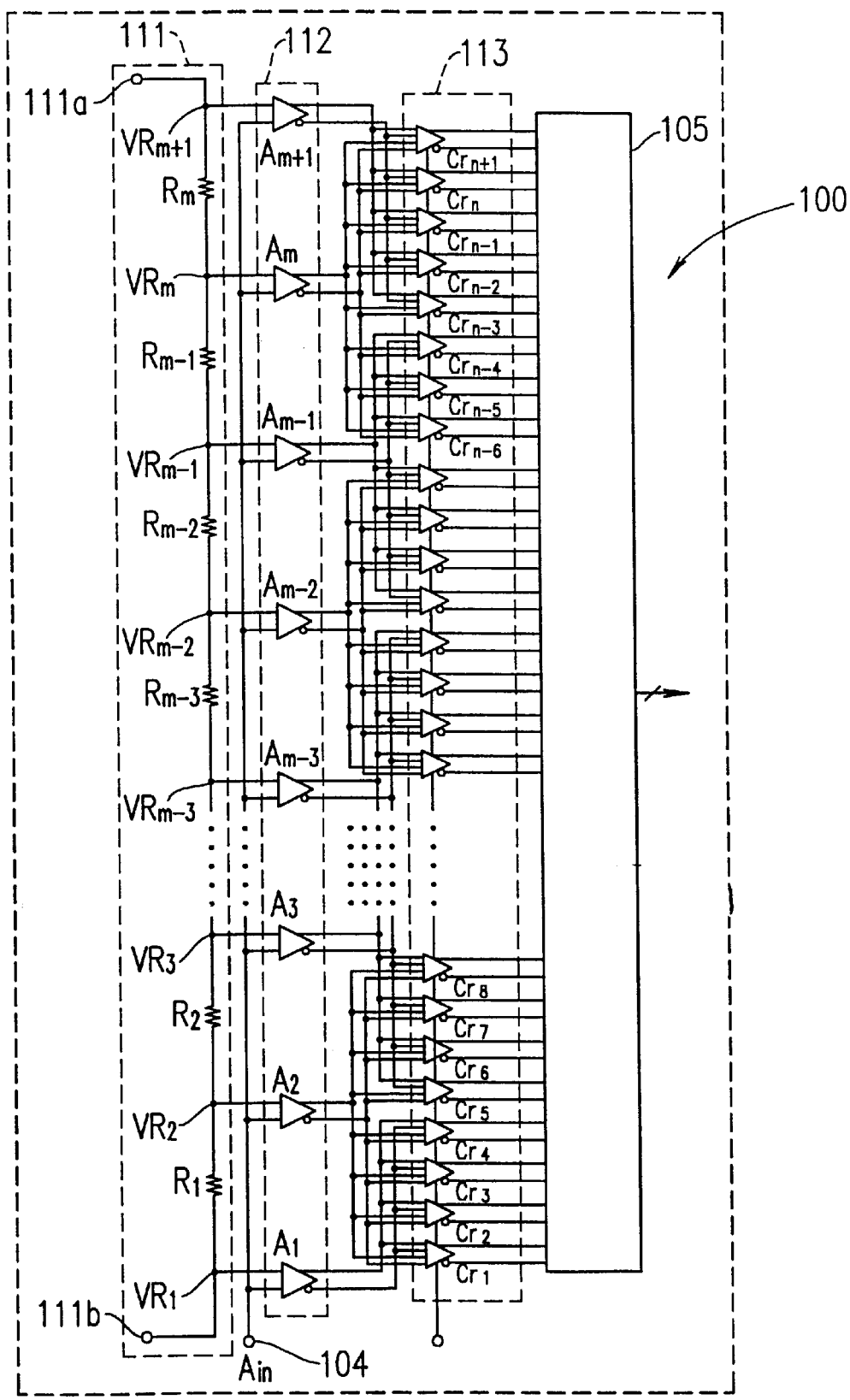
FIG. 1 is a diagram showing a structure of an A/D converter according to Embodiment 1 of the present invention.

FIG. 1 is a diagram showing a structure of an A/D converter 100 according to Embodiment 1 of the present invention. The A/D converter 100 includes a reference voltage generator circuit (reference voltage generation section) 111, a differential amplifier array (differential amplification section) 112, and an operating circuit (operating section) 113. The A/D converter 100 can further include an encoder circuit (encoding section) 105. The reference voltage generator circuit 111 generates a plurality of reference voltages $VR_1$–$VR_{m+1}$. The differential amplifier array 112 includes m+1 differential amplifiers $A_1$–$A_{m+1}$ and amplifies voltage differences between each of the plurality of reference voltages $VR_1$–$VR_{m+1}$ and an input analog signal voltage $A_{in}$ input via an analog signal voltage input terminal 104, so as to generate a plurality of output voltage sets. Each of the plurality of output voltage sets includes complementary non-inverted and inverted output voltages. The operating circuit 113 receives the plurality of output voltage sets and is operated in accordance with a clock signal. The operating circuit 113 further includes n+1 comparator circuits (comparison section) $Cr_1$–$Cr_{n+1}$. Each of the comparator circuits $Cr_1$–$Cr_{n+1}$ has four input terminals. The non-inverted and inverted output voltages included in the plurality of output voltage sets provided by the differential amplifiers $A_1$–$A_{m+1}$ are directly input to a corresponding one of the comparator circuits $Cr_1$–$Cr_{n+1}$.

Each of the comparator circuits $Cr_1$–$Cr_{n+1}$ has an input transistor section and a positive-feedback section. The input transistor section receives first and second output voltage sets of the plurality of output voltage sets. The positive-feedback section is operated in accordance with a clock signal.

The encoder circuit 105 encodes comparison results (digital signals) so as to generate a digital data signal.

Each of the above-described elements is described in detail below.

The reference voltage generator circuit 111 includes m resistors $R_1$–$R_m$ which are serially connected together. A top level reference voltage 111a and a bottom level reference voltage 111b are applied to opposite ends of the series of resistors $R_1$–$R_m$. The series of resistors $R_1$–$R_m$ divide a voltage, which is applied between terminals to which the top level reference voltage 111a and the bottom level reference voltage 111b are applied, so as to generate the reference voltages $VR_1$–$VR_{m+1}$.

Each of the differential amplifiers $A_1$–$A_{m+1}$ included in the differential amplifier array 112 has two input terminals. An input analog signal voltage $A_{in}$ is input to one of the two input terminals of each of the differential amplifiers $A_1$–$A_{m+1}$, and each of the reference voltages $VR_1$–$VR_{m+1}$ is input to the other one of the two input terminals of a corresponding one of the differential amplifiers $A_1$–$A_{m+1}$. As a result, each of the differential amplifiers $A_1$–$A_{m+1}$ outputs a set of a plurality of output voltages (e.g., the first output voltage set, the second output voltage set, or the like). Each set of the plurality of output voltages includes one of non-inverted output voltages $V_1$–$V_{m+1}$ and a corresponding one of inverted output voltages $VB_1$–$VB_{m+1}$, which are complementary to each other.

An input transistor section of each of the comparator circuits $Cr_1$–$Cr_{n+1}$ in the operating circuit 113 performs a prescribed weighting calculation so as to determine a threshold voltage Vtn and outputs to the positive-feedback section, in the same comparator circuit, a comparison result obtained by comparing the difference between first non-inverted and inverted output voltages with the difference between second non-inverted and inverted output voltages. The first non-inverted and inverted output voltages are included in the first output voltage set, and the second non-inverted and inverted output voltages are included in the second output voltage set.

When a clock signal is at a prescribed level, the feedback section amplifies the comparison result output by the input transistor section and retains the amplified comparison result while outputting the amplified comparison result as a digital signal to the encoder circuit 105. The digital signal is a "High-level" or a "Low-level" digital signal representing a comparison result.

The comparator circuit included in the operating circuit 113 used in Embodiment 1 of the present invention is now described.

Figure 2:
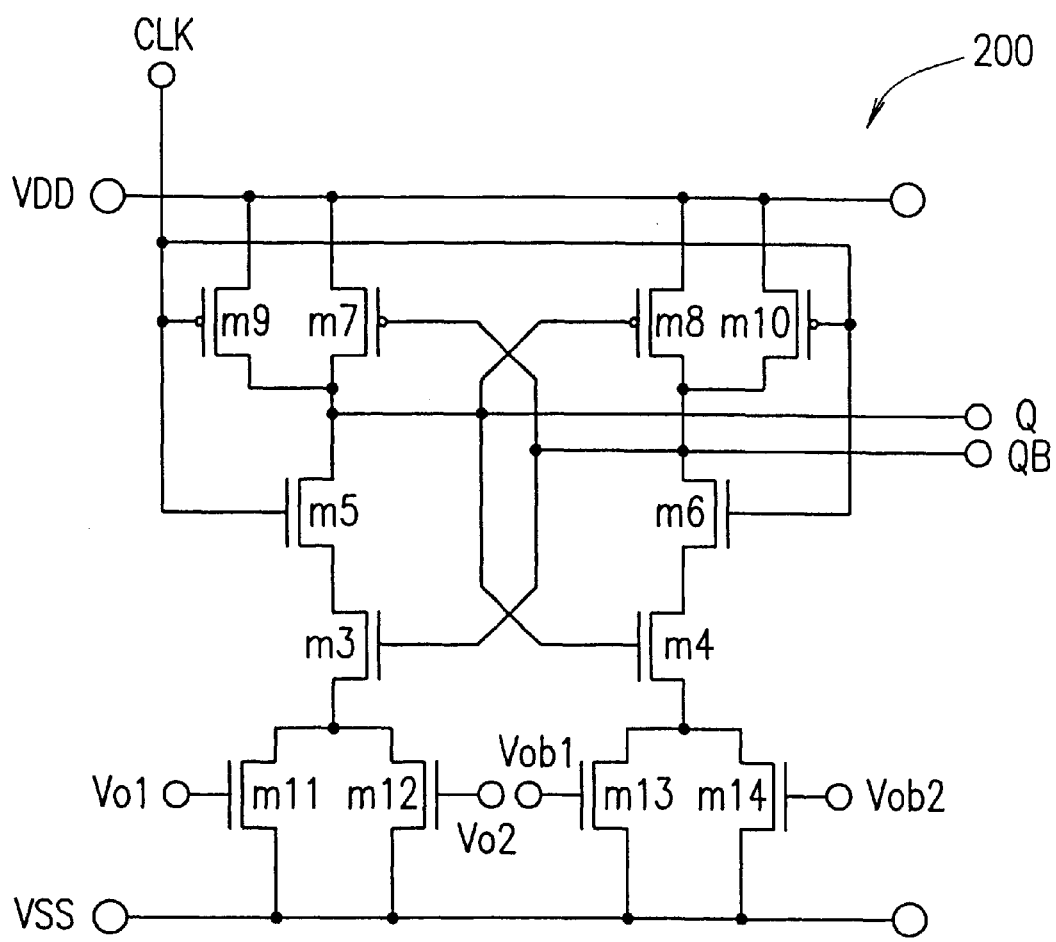
FIG. 2 is a circuit diagram of a comparator circuit included in an operating circuit used in Embodiment 1 of the present invention.

FIG. 2 is a circuit diagram of a comparator circuit 200 included in the operating circuit 113 used in Embodiment 1 of the present invention.

The comparator circuit 200 includes an input transistor section, which includes NMOS transistors m11, m12, m13, and m14, and a positive-feedback section (cross-coupled inverter latch section), which includes NMOS transistors m3 and m4 and PMOS transistors m7 and m8. Output terminals Q and QB are connected to gates of the positive-feedback section. Further, an NMOS switch transistor m5 is connected between drains of the NMOS transistor m3 and the PMOS transistor m7, and an NMOS switch transistor m6 is connected between drains of the NMOS transistor m4 and the PMOS transistor m8. However, the locations of the NMOS switch transistors m5 and m6 are not limited to this. Furthermore, a PMOS switch transistor m9 is provided between the drain of the PMOS transistor m7 and a power supply VDD, and a PMOS switch transistor m10 is provided between the drain of the PMOS transistor m8 and the power supply VDD. A terminal CLK is connected to the NMOS switch transistors m5 and m6 and the PMOS switch transistors m9 and m10 at their respective gates. NMOS transistors m11 and m12 are provided between a source of the NMOS transistor m3 and ground VSS. Input terminals Vo1 and Vo2 are respectively connected to the NMOS transistors m11 and m12 at their gates. NMOS transistors m13 and m14 are provided between a source of the NMOS transistor m4 and the ground VCC. Input terminals Vob1 and Vob2 are respectively connected to the NMOS transistors m13 and m14 at their gates.

As described above, the input transistor section performs a prescribed weighting calculation so as to determine a threshold voltage Vtn and outputs to the positive-feedback section, in the same comparator circuit, a comparison result obtained by comparing the difference between first non-inverted and inverted output voltages with the difference between second non-inverted and inverted output voltages. The prescribed weighting calculation is realized by, for example, setting the size ratio between transistors of the input transistor section so as to be constant. For example, by setting the size ratio between the transistors m11 and m12 and the size ratio between the transistors m13 and m14 so as to be 1:3, the threshold voltage Vtn can be obtained. It should be noted that an arbitrary method can be used for realizing the above-described prescribed weighting calculation. For example, the above-described prescribed weighting calculation can be realized by setting the size ratio between the transistors in the input transistor section with respect to a gate length or width so as to be constant.

When the clock signal is at a prescribed level, the positive-feedback section amplifies the comparison result output by the input transistor section and retains the amplified comparison result while outputting the amplified comparison result as a digital signal to the encoder circuit 105.

Although Embodiment 1 of the present invention has been described in conjunction with the case where the number of the comparator circuits to which the first and second output voltage sets are input is four, the present invention is not limited to this. The number of the comparator circuits can be $2^n$ (n is an integer), for example, 2, 8, etc.

The operation of the comparator circuit 200 is now described with reference to FIGS. 2 and 3.

Figure 3:
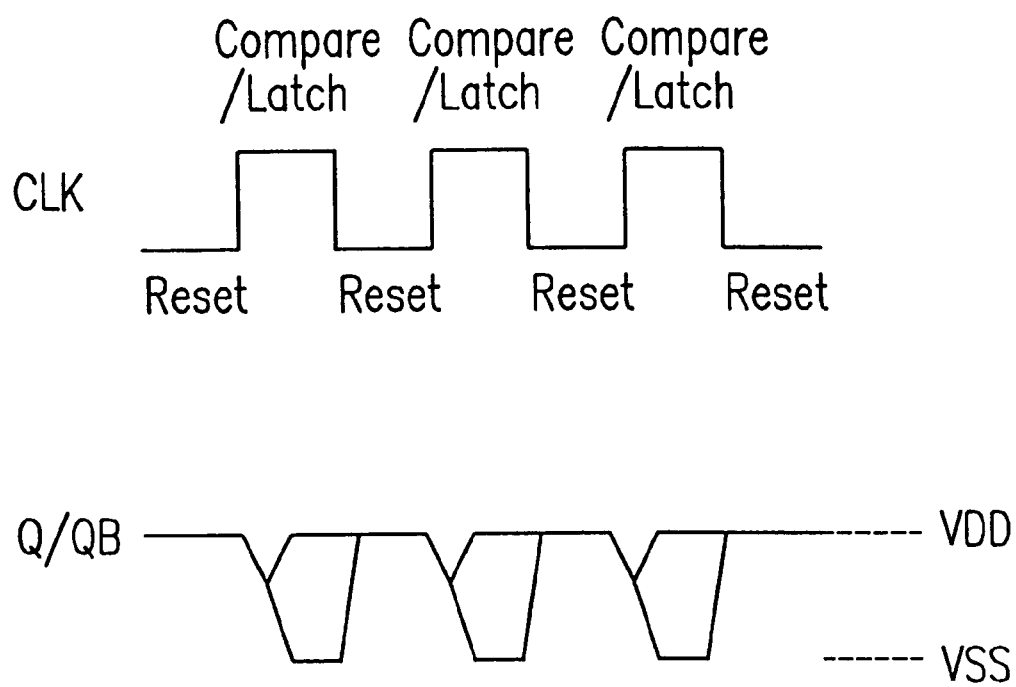
FIG. 3 is a diagram showing waveforms of a clock signal input to a terminal CLK of the comparator circuit of FIG. 2 and outputs Q and QB of the comparator circuit.

FIG. 3 is a diagram showing waveforms of a clock signal input to the terminal CLK and outputs Q and QB of the comparator circuit 200.

When the clock signal is at a "Low" level, the NMOS switch transistors m5 and m6 (FIG. 2) are turned off and the PMOS switch transistors m9 and m10 (FIG. 2) are turned on. As a result, the positive-feedback section is not operated, and the outputs Q and QB are pulled up to a power supply voltage, so that the outputs Q and QB are fixed at a "High" level (i.e., in a "Reset" state). In this case, no current flows in the comparator circuit 200.

When the clock signal is at a "High" level, the NMOS switch transistors m5 and m6 are turned on and the PMOS switch transistors m9 and m10 are turned off. As a result, the positive-feedback section is brought into operation. In this case, each of the NMOS transistors m11, m12, m13 and m14 (FIG. 2) is operated in a linear region where a drain current varies linearly due to a gate voltage, so that a drain voltage $V_{DS1}$ is generated in accordance with an input signal applied to gates of the NMOS transistors m11 and m12, and a drain voltage $V_{DS2}$ is generated in accordance with an input signal applied to gates of the NMOS transistors m13 and m14. The positive-feedback section performs positive feedback on a voltage difference between the drain voltages $V_{DS1}$ and $V_{DS2}$ so as to be amplified to the level of the power supply voltage (VDD), and retains the state of the amplified voltage difference (a "Compare and Latch" state). In this case, the clock signal becomes "High", and therefore according to the input signals applied to the gates of the NMOS transistors m11, m12, m13 and m14, current flows through the comparison circuit 200 until the outputs Q and QB of the comparator circuit 200 are amplified, but current does not flow into the comparator circuit 200 while the outputs Q and QB are retained in the comparator circuit 200.

For example, in the case where $V_{DS1} > V_{DS2}$, when positive feedback is performed on the voltage difference between $V_{DS1}$ and $V_{DS2}$, the output Q is amplified to the level of the power supply voltage (VDD) and the output QB is amplified to the level of the ground (VSS). On the contrary, in the case where $V_{DS1} < V_{DS2}$, when positive feedback is performed on the voltage difference between $V_{DS1}$ and $V_{DS2}$, the output Q is amplified to the level of the ground (VSS) and the output QB is amplified to the level of the power supply voltage (VDD).

In the case where gate widths of the NMOS transistors m11 and m13 are $W_1$, gate widths of the NMOS transistors m12 and m14 are $W_2$, gate lengths of the NMOS transistors m11, m12, m13 and m14 are L, a threshold voltage of the comparator circuit 200 is $V_T$, carrier mobility is $\mu_n$, gate capacitance is Cox, and gate-source voltages of the NMOS transistors m11, m12, m13 and m14 are $V_{GS1}$ (=Vo1), $V_{GS2}$(=Vo2), $V_{GS3}$(=Vob1), and $V_{GS4}$(=Vob2), respectively, the respective drain conductances $G_{11}$, $G_{12}$, $G_{13}$ and $G_{14}$ of the NMOS transistors m11, m12, m13 and m14 are represented by the following expressions (1.1)–(1.4):

$$G_{11} = \mu_n \cdot Cox \cdot (W_1/L)(Vo1 - V_T - V_{DS1}) \quad (1.1);$$

$$G_{12} = \mu_n \cdot Cox \cdot (W_2/L)(Vo2 - V_T - V_{DS1}) \quad (1.2);$$

$$G_{13} = \mu_n \cdot Cox \cdot (W_1/L)(Vob1 - V_T - V_{DS2}) \quad (1.3); \text{ and}$$

$$G_{14} = \mu_n \cdot Cox \cdot (W_2/L)(Vob2 - V_T - V_{DS2}) \quad (1.4).$$

The threshold voltage of the comparator circuit 200 of FIG. 2 is obtained when $V_{DS1} = V_{DS2}$, i.e., the sum of the respective drain conductances $G_{11}$ and $G_{12}$ of the NMOS transistors m11 and m12 is equal to that of the respective drain conductances $G_{13}$ and $G_{14}$ of the NMOS transistors m13 and m14. From expressions (1.1)–(1.4), the relationship $G_{11} + G_{12} = G_{13} + G_{14}$ is represented by $$\mu_n \cdot Cox \cdot [(W_1/L)(Vo1 - V_T - V_{DS1}) + (W_2/L)(Vo2 - V_T - V_{DS1})] = \mu_n \cdot Cox \cdot [(W_1/L)(Vob1 - V_T - V_{DS2}) + (W_2/L)(Vob2 - V_T - V_{DS2})].$$

Therefore, the following expression (1.5) is obtained.

$$W_1 Vo1 + W_2 Vo2 = W_1 Vob1 + W_2 Vob2 \quad (1.5)$$

In the case where the size ratio between the gate lengths $W_1$ and $W_2$ is n/m: (m−n)/m, from expression (1.5), the following expression (1.6) is obtained.

$$(nVo1+(m-n)Vo2)/m=(nVob1+(m-n)Vob2)/m \quad (1.6)$$

Expression (1.6) is described in detail with reference to FIG. 4.

Figure 4:
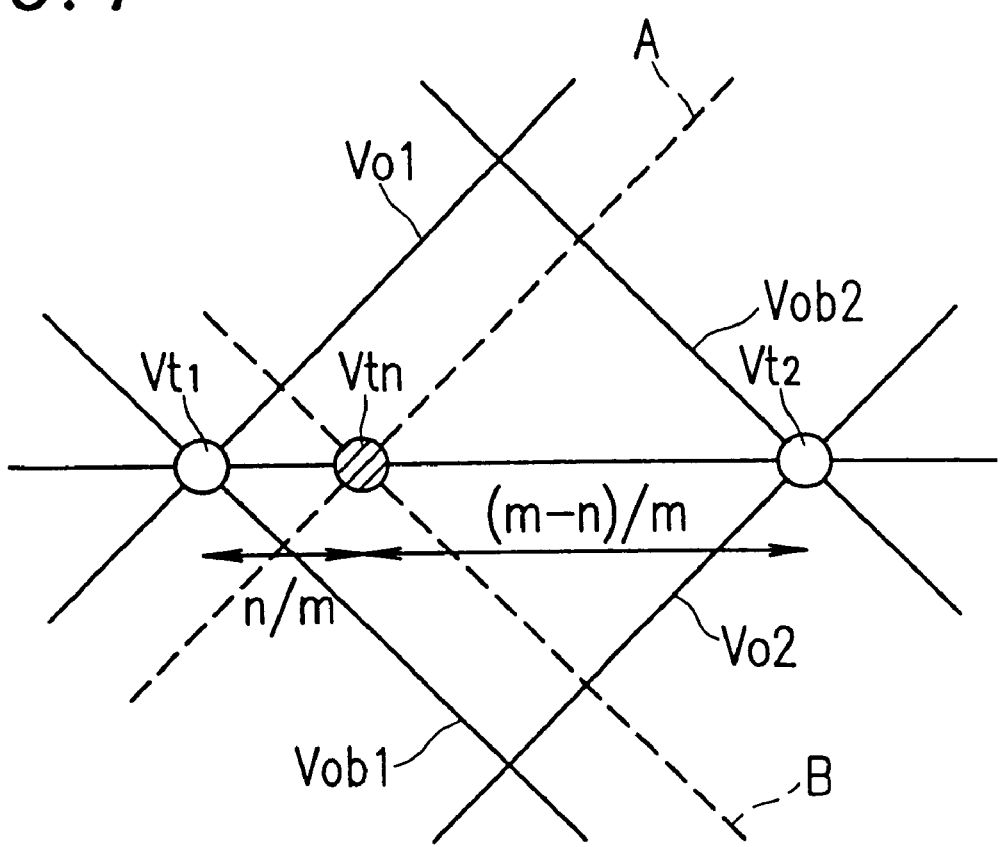
FIG. 4 is a diagram showing trajectories of input signals Vo1, Vob1, Vo2, and Vob2 and a threshold voltage of the comparator circuit of FIG. 2.

FIG. 4 is a diagram showing trajectories of input signals Vo1, Vob1, Vo2 and Vob2 and the threshold voltage of the comparator circuit 200. In FIG. 4, broken line A represents the trajectory of the left side of expression (1.6) which extends in parallel with the input signals Vo1 and Vo2 such that the ratio between a distance from the trajectory of the input signal Vo1 to broken line A and a distance from the trajectory of the input signals Vo2 to broken line A is n:m−n, and broken line B represents the trajectory of the right side of expression (1.6) which extends in parallel with the input signals Vob1 and Vob2 such that the ratio between a distance from the trajectory of the input Vob1 to broken line B and a distance from the trajectory of the input Vob2 to broken line B is n:m−n. An intersection Vtn between broken lines A and B represents a threshold voltage of the comparator circuit 200. In this case, the intersection Vtn divides a line extending between an intersection Vt1 of the input signals Vo1 and Vob1 and an intersection Vt2 of the input signals Vo2 and Vob2 at a ratio of n:m−n. For example, in the case where m=4, when n=1, the size ratio ($W_1:W_2$) between the NMOS transistor m11 or m13 (FIG. 2) and the NMOS transistor m12 or m14 (FIG. 2) with respect to gate width is 1:3, and therefore the threshold voltage Vtn of the comparator circuit 200 divides the line extending between the intersections Vt1 and Vt2 at a ratio of 1:3. When n=2, the size ratio ($W_1:W_2$) between the NMOS transistor m11 or m13 and the NMOS transistor m12 or m14 with respect to gate width is 2:2, and therefore the threshold voltage Vtn of the comparator circuit 200 divides the line extending between the intersections Vt1 and Vt2 at a ratio of 2:2. When n=3, the size ratio ($W_1:W_2$) between the NMOS transistor m11 or m13 and the NMOS transistor m12 or m14 with respect to gate width is 3:1, and therefore the threshold voltage Vtn of the comparator circuit 200 divides the line extending between the intersections Vt1 and Vt2 at a ratio of 3:1. In this manner, by setting the size ratio ($W_1:W_2$) between the NMOS transistor m11 or m13 and the NMOS transistor m12 or m14 with respect to gate width so as to be n/m:(m−n)/m, it is possible to obtain a threshold voltage Vtn of the comparator circuit 200 which suitably divides the line extending between the intersections Vt1 and Vt2 at an arbitrary ratio.

As described above, according to Embodiment 1 of the present invention, by configuring transistors included in the input transistor section of the comparator circuit 200 so as to have an arbitrary size ratio (by weighting the transistors), it is possible to eliminate the interpolation resistor array as used with conventional techniques. Accordingly, an operating current required by an interpolator circuit and an area occupied by the interpolator circuit are not necessary, and therefore a low-power consuming and low-cost A/D converter can be realized.

Although significant offset occurs in the dynamic comparator circuit, a differential amplification section is provided in a preceding stage of the comparator circuit according to the present invention, and therefore it is possible to control the influence of the offset of the dynamic comparator circuit on the side of input signal voltages so as to be 1/y, where y is the gain for the differential amplification section. In this manner, the present invention allows the dynamic comparator circuit to be practicable. Moreover, even if the offset occurs in the output of differential amplifiers, non-inverted output voltages and inverted output voltages of two adjacent differential amplifiers are input to a plurality of comparator circuits on which a prescribed weighting calculation is performed so as to have arbitrary threshold voltage values, and thus the offset in the differential amplifiers is dispersed to each of the plurality of comparator circuits. Therefore, the influence of the offset can be reduced to the reciprocal of the number of comparator circuits.

It should be noted that the A/D converter 100 according to Embodiment 1 of the present invention can be formed on a single chip (represented by the region enclosed by the broken line in FIG. 1). In this manner, by forming the A/D converter 100 on a single chip so as to efficiently arrange circuits in the A/D converter 100, an effect of reducing an area occupied by such circuits is increased.

(Embodiment 2)

As Embodiment 2 of the present invention, an A/D converter having less differential amplifiers than the A/D converter 100 according to Embodiment 1 of the present invention is described.

Figure 5:
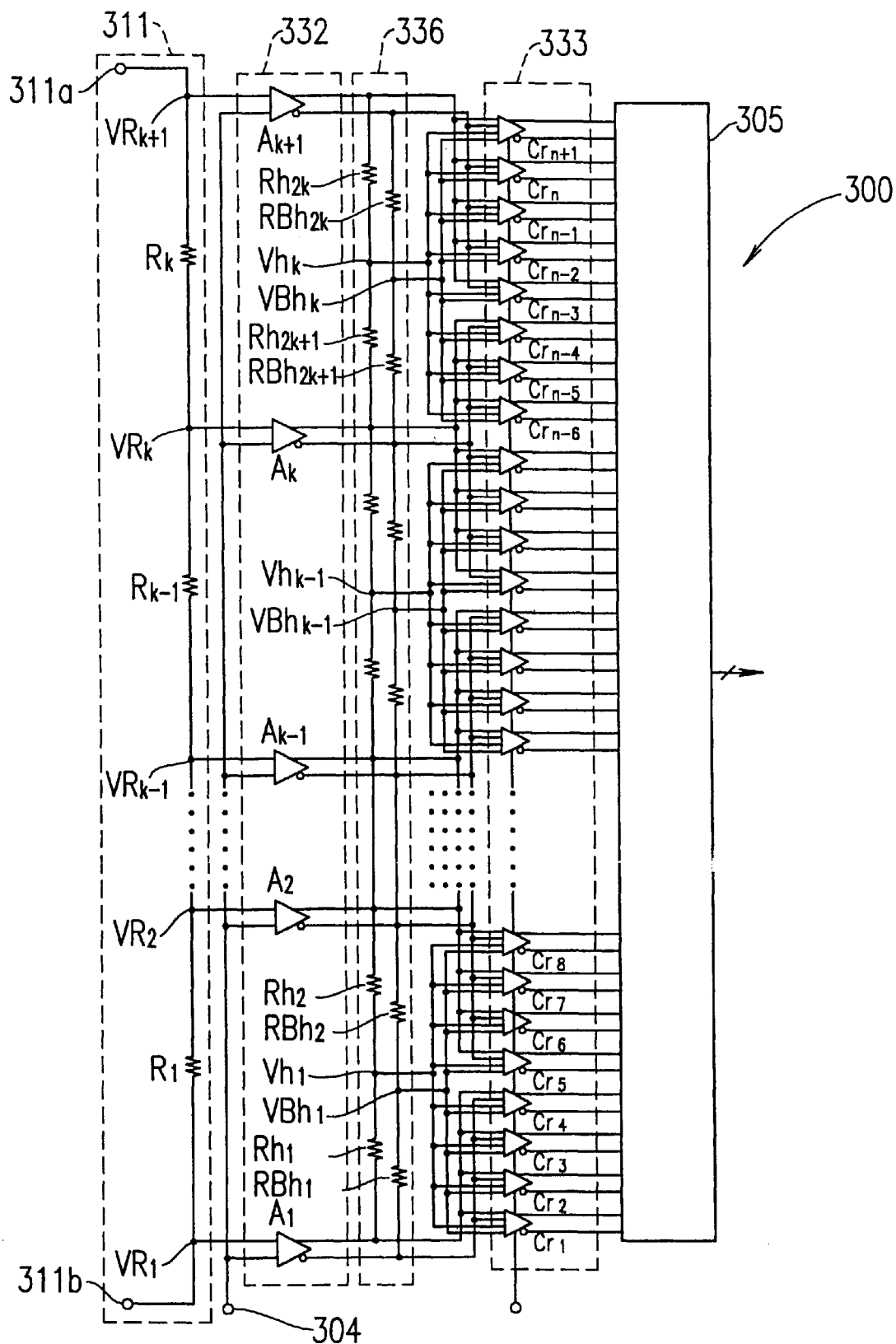
FIG. 5 is a diagram showing a structure of an A/D converter according to Embodiment 2 of the present invention.

FIG. 5 is a diagram showing a structure of an A/D converter 300 according to Embodiment 2 of the present invention. In the A/D converter 300, the number of differential amplifiers $A_1$–$A_{k+1}$ included in a differential amplifier array 332 is less than that of differential amplifiers included in the differential amplifier array 112 of the A/D converter 100 according to Embodiment 1 of the present invention. Further, the A/D converter 300 is different from the A/D converter 100 according to Embodiment 1 of the present invention in that the differential amplifiers $A_1$–$A_{k+1}$ include resistors connected between two corresponding adjacent output terminals. Furthermore, connections between the differential amplifiers $A_1$–$A_{k+1}$ and comparator circuits $Cr_1$–$Cr_{n+1}$ included in an operating circuit are made in a different manner from Embodiment 1 of the present invention.

Specifically, in the differential amplifiers $A_1$–$A_{k+1}$ according to Embodiment 2, interpolation resistors $Rh_1$–$Rh_{2k}$ are connected between two corresponding non-inverted output voltage terminals of adjacent differential amplifiers $A_1$–$A_{k+1}$, and interpolation resistors $RBh_1$–$RBh_{2k}$ are connected between corresponding two inverted output voltage terminals of adjacent differential amplifiers $A_1$–$A_{k+1}$. These interpolation resistors $Rh_1$–$Rh_{2k}$ and $RB_{h1}$–$RB_{h2k}$ generate interpolated voltages. In Embodiment 2 of the present invention, outputs of the differential amplifiers $A_1$–$A_{k+1}$ and the interpolated voltages generated by the interpolation resistors $Rh_1$–$Rh_{2k}$ and $RBh_1$–$RBh_{2k}$ are input to the comparator circuits $Cr_1$–$Cr_{n+1}$. Since the comparator circuits $Cr_1$–$Cr_{n+1}$ perform voltage comparison using the interpolated voltages, the number of differential amplifiers can be reduced in comparison with Embodiment 1 of the present invention. Specifically, Embodiment 1 of the present invention requires m+1 differential amplifiers, while Embodiment 2 of the present invention requires k+1 differential amplifiers, where k=m/2. Accordingly, the number of differential amplifiers according to Embodiment 2 of the present invention can be reduced to m/2+1 in comparison with Embodiment 1 of the present invention.

Next, the comparison operation of the A/D converter 300 according to Embodiment 2 of the present invention is described with respect to two exemplary differential amplifiers $A_1$ and $A_2$. A voltage applied between terminals of the differential amplifiers $A_1$ and $A_2$ from which non-inverted output voltages are output is interpolated by interpolation resistors $Rh_1$ and $Rh_2$ so as to generate interpolated voltage $Vh_1$. A voltage applied between terminals of the differential amplifiers $A_1$ and $A_2$ from which inverted output voltages are output is interpolated by interpolation resistors $RBh_1$ and $RBh_2$ so as to generate interpolated voltage $VBh_1$. The non-inverted and inverted output voltages of the differential amplifier $A_1$ and the interpolated voltages $Vh_1$ and $VBh_1$ are input to the comparator circuits $Cr_1$–$Cr_4$. By setting the size ratio between transistors in the comparator circuits $Cr_1$–$Cr_4$ to which the non-inverted and inverted output voltages of the differential amplifier $A_1$ are input and setting the size ratio between transistors to which the interpolated voltages $Vh_1$ and $VBh_1$ are input so as to be prescribed values, it is possible to obtain similar comparison results to the A/D converter 100 according to Embodiment 1. Further, in the comparator circuits $Cr_5$–$Cr_8$ to which non-inverted and inverted output voltages of the differential amplifier $A_2$ and interpolated voltages $Vh_2$ and $VBh_2$ are input, it is also possible to obtain similar comparison results to the A/D converter 100 according to Embodiment 1.

In the A/D converter 300 according to Embodiment 2, the non-inverted and inverted output voltages of the differential amplifier $A_2$ according to Embodiment 1 shown in FIG. 1 respectively correspond to the interpolated voltages $Vh_1$ and $VBh_1$ shown in FIG. 5. Accordingly, in the case of performing A/D conversion using the same reference voltages in Embodiments 1 and 2, three differential amplifiers are required in Embodiment 1, while only two differential amplifiers are required in Embodiment 2, whereby it is possible to reduce the power consumption and the number of elements (area occupied by differential amplifiers) in accordance with the number of reduced differential amplifiers. Further, since interpolation resistors are connected between terminals of two adjacent differential amplifiers to which non-inverted output voltages are applied and other interpolation resistors are connected between terminals of the two adjacent differential amplifiers to which inverted output voltages are applied, the interpolation resistors have a function of averaging the non-inverted and inverted output voltages. Therefore, when offset occurs in the output of the two adjacent differential amplifiers, the interpolation resistors connected to the non-inverted and inverted output terminals of the two adjacent differential amplifiers average the offset, and therefore the influence of the offset on the differential amplifiers can be reduced, as compared to Embodiment 1 of the present invention.

(Embodiment 3)

Figure 6:
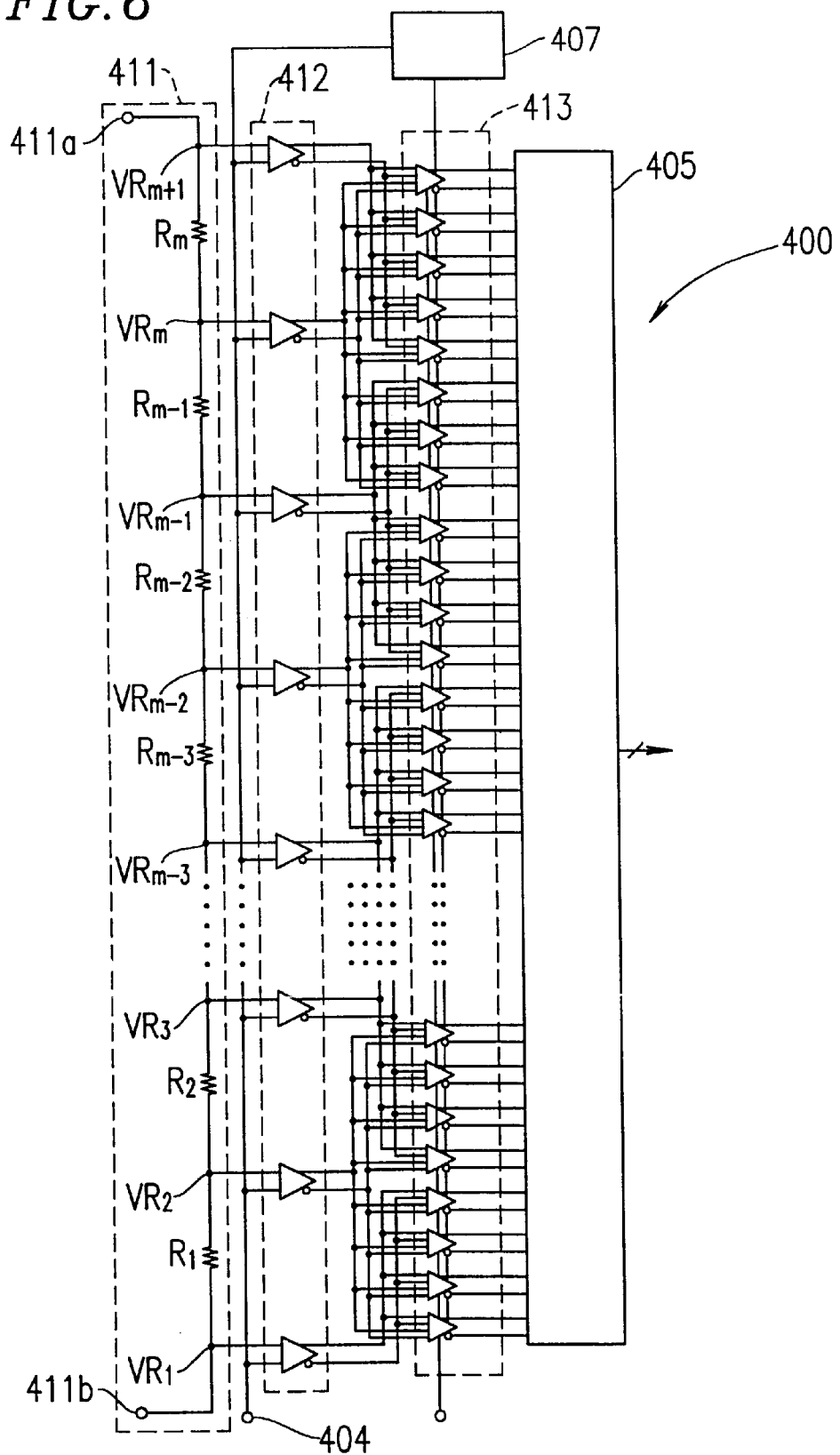
FIG. 6 is a diagram showing a structure of an A/D converter according to Embodiment 3 of the present invention.

FIG. 6 is a diagram showing a structure of an A/D converter 400 according to Embodiment 3 of the present invention. The A/D converter 400 can further reduce the power consumption in comparison with the A/D converter 100 according to Embodiment 1 of the present invention. The structure of the A/D converter 400 is substantially the same as that of the A/D converter 100, except that the A/D converter 400 includes an input signal voltage level detector circuit (an input signal voltage level detection section) 407 for controlling an operating section according to the level of an input signal voltage, and therefore the detailed description of the structure of the A/D converter 400 is omitted herein.

Figure 7:
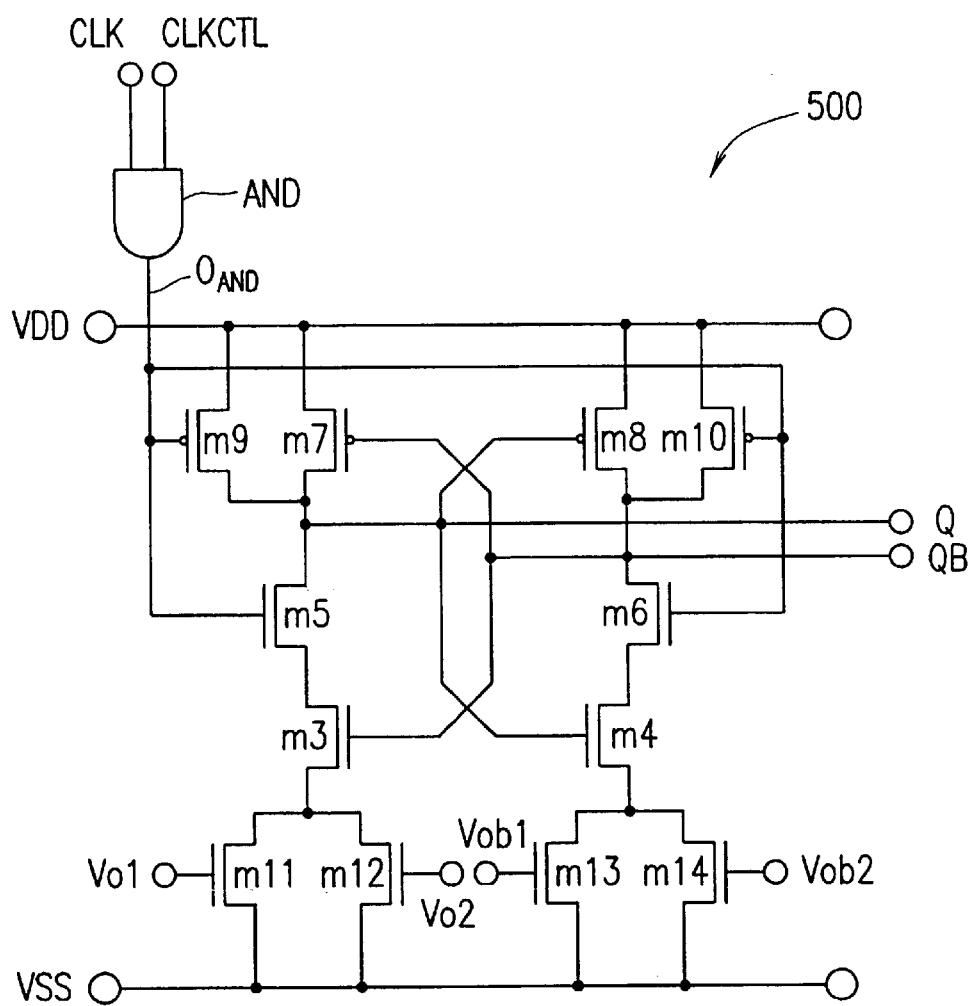
FIG. 7 is a circuit diagram of a comparator circuit included in an operating circuit connected to an input signal voltage level detection circuit used in Embodiment 3 of the present invention.

FIG. 7 is a circuit diagram of a comparator circuit 500 included in an operating circuit 413 connected to the input signal voltage level detection circuit 407 used in Embodiment 3 of the present invention.

The comparator circuit 500 is the same as the comparator circuit 200 according to Embodiment 1 shown in FIG. 2, except that the comparator circuit 500 includes an additional logic circuit AND, a clock signal and a control signal are input to the logic circuit AND at terminals CLK and CLKCTL, respectively, and an output terminal $O_{AND}$ is connected to the PMOS switch transistors m9 and m10 and the NMOS switch transistors m5 and m6.

The operation of the A/D converter 400 according to Embodiment 3 having the above structure is described below. Table 1 shows the logic of the logic circuit AND.

TABLE 1

| CLK | CLKCTL | $O_{AND}$ |
| --- | --- | --- |
| L | L | L |
| H | L | L |
| L | H | L |
| H | H | H |

In the case where the control signal input to the terminal CLKCTL is at a "Low" level, whether the clock signal input to the terminal CLK is at a "High" or "Low" level, the logic circuit AND outputs a "Low" level signal from the terminal $O_{AND}$. Alternatively, in the case where the control signal input to the terminal CLKCTL is at a "High" level, the logic circuit AND outputs a "Low" level signal from the terminal $O_{AND}$ when the clock signal input to the terminal CLK is at a "Low" level, and the logic circuit AND outputs a "High" level signal from the terminal $O_{AND}$ when the control signal input to the terminal CLK is at a "High" level (i.e., the logic of the clock signal input to the terminal CLK is output as it is).

As described above, when the clock signal input to the terminal CLKCTL is at a "Low" level, the logic circuit AND always outputs a "Low" level signal, and therefore the comparator circuit 500 is always in a "Reset mode", so that the comparator circuit 500 is not operated and no operating current flows into the comparator circuit 500. On the contrary, when the clock signal input to the terminal CLKCTL is at a "High" level, the logic circuit AND always outputs to the terminal $O_{AND}$ the logic of a signal input to the terminal CLK as it is, and therefore only when a "High" level signal is input to the terminal CLK, the comparator circuit 500 performs voltage comparison according to the level of the differential voltages input to the input terminals Vo1, Vob1, Vo2, and Vob2 and amplifies the comparison result. Thereafter, the comparison result is retained without requiring operating current.

In this manner, it is possible to control the operation of the comparator circuit 500 according to a clock signal input to the terminal CLKCTL. This operation control is realized, for example, by setting a "High" level clock signal input to the terminal CLKCTL so as to be an operating signal and setting a "Low" level clock signal input to the terminal CLKCTL so as to be a stop signal.

The input signal voltage level detection circuit 407 shown in FIG. 6 receives an analog signal input to the analog signal voltage input terminal 404 and outputs a "High" level operating signal only to comparator circuits required to be operated, so as to bring such comparator circuits into a comparison operation state. The input signal voltage level detection circuit 407 outputs a "Low" level stop signal to the other comparator circuits so as to be brought into a comparison stopped state. In this manner, in the A/D converter 400 according to Embodiment 3 of the present invention, only the comparator circuits required are operated according to the voltage level of analog signals and the operation of the other non-required comparator circuits is caused to stop, and therefore it is possible to significantly reduce the power consumption.

(Embodiment 4)

As Embodiment 4 of the present invention, a preferred layout of transistors included in an input transistor section of a comparison circuit for use in an A/D converter according to the present invention is described.

Figure 8:
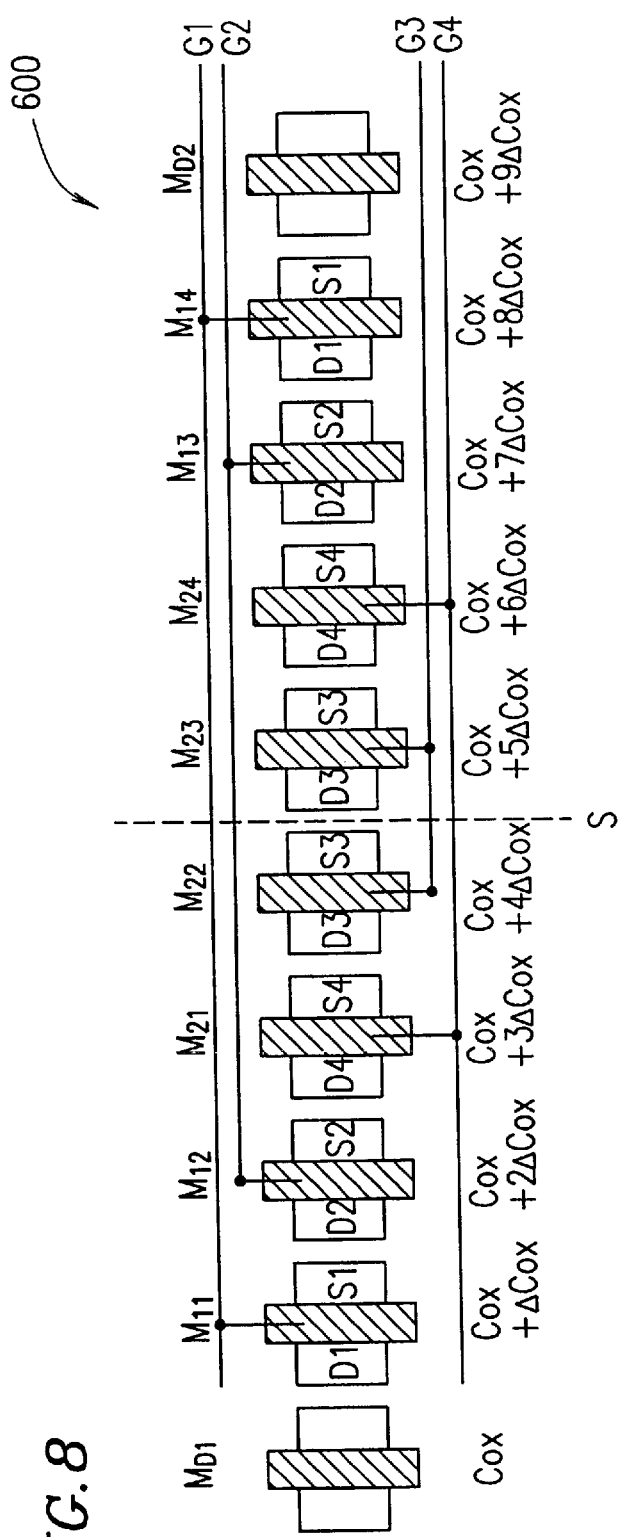
FIG. 8 is a diagram showing an example of a layout of transistors.

FIG. 8 is a diagram showing an example of a layout of transistors. A layout 600 shown in FIG. 8 can be applied to, for example, the NMOS transistors m11, m12, m13 and m14 included in the input transistor section of the comparator circuit 200 used in the A/D converter 100 according to Embodiment 1 of the present invention. FIG. 8 shows the case where the size ratio between two transistors included in each of the NMOS transistors m11, m12, m13 and m14 with respect to gate width is 2:2. The NMOS transistor m11 includes transistor patterns $M_{11}$ and $M_{14}$ having the same shape and size, and the NMOS transistor m12 includes transistor patterns $M_{12}$ and $M_{13}$ having the same shape and size. In FIG. 8, reference numerals D1, G1, and S1 respectively denote a drain, a gate, and a source of the NMOS transistor m11, and reference numerals D2, G2, and S2 respectively denote a drain, a gate, and a source of the NMOS transistor m12. Further, the NMOS transistor m13 includes transistor patterns $M_{22}$ and $M_{23}$ having the same shape and size, and the NMOS transistor m14 includes transistor patterns $M_{21}$ and $M_{24}$ having the same shape and size. In FIG. 8, reference numerals D3, G3, and S3 respectively denote a drain, a gate, and a source of the NMOS transistor m13, and reference numerals D4, G4, and S4 respectively denote a drain, a gate, and a source of the NMOS transistor m14. The gates G1 and G2 are connected to the input terminals Vo1 and Vo2 (FIG. 2), respectively. Further, the gates G3 and G4 are connected to the input terminals Vob1 and Vob2 (FIG. 2), respectively. In FIG. 8, the transistor patterns are arranged in the following order, from the left, $M_{11}$, $M_{12}$, $M_{21}$, $M_{22}$, $M_{23}$, $M_{24}$, $M_{13}$, and $M_{14}$. Dummy transistor patterns $M_{D1}$ and $M_{D2}$ are provided at opposite ends of a series of the transistor patterns $M_{11}$, $M_{12}$, $M_{21}$, $M_{22}$, $M_{23}$, $M_{24}$, $M_{13}$, and $M_{14}$. The dummy transistor patterns $M_{D1}$ and $M_{D2}$ have the same shape and size as that of the transistor patterns $M_{11}$, $M_{12}$, $M_{21}$, $M_{22}$, $M_{23}$, $M_{24}$, $M_{13}$, and $M_{14}$. In this manner, the dummy transistor patterns $M_{D1}$ and $M_{D2}$ having the same shape and size as that of the transistor patterns $M_{11}$, $M_{12}$, $M_{21}$, $M_{22}$, $M_{23}$, $M_{24}$, $M_{13}$, and $M_{14}$ are provided at opposite ends of the series of the transistor patterns $M_{11}$, $M_{12}$, $M_{21}$, $M_{22}$, $M_{23}$, $M_{24}$, $M_{13}$, and $M_{14}$, so that it is possible to maintain the precision of gate patterns of the transistor patterns $M_{11}$, $M_{12}$, $M_{21}$, $M_{22}$, $M_{23}$, $M_{24}$, $M_{13}$, and $M_{14}$. In the case where no dummy patterns are provided at opposite ends of the series of the transistor patterns $M_{11}$, $M_{12}$, $M_{21}$, $M_{22}$, $M_{23}$, $M_{24}$, $M_{13}$, and $M_{14}$, the as-fabricated state of the transistors ($M_{11}$ and $M_{14}$) at both ends of the series of the transistor patterns is different from that of the other transistors, and therefore characteristics of the transistors become uneven.

For example, in the case where there are gradation in gate capacitance between transistors, as described below, by employing the arrangement shown in FIG. 8, the series of the transistor patterns $M_{11}$, $M_{12}$, $M_{21}$, $M_{22}$, $M_{23}$, $M_{24}$, $M_{13}$, and $M_{14}$ become linearly-symmetrical with respect to a center line of the input transistor section (represented by the broken line in FIG. 8), and therefore the unevenness in transistor characteristic can be reduced. Specifically, in the case where the assumption that gate capacitances of the transistor patterns $M_{11}$, $M_{12}$, $M_{21}$, $M_{22}$, $M_{23}$, $M_{24}$, $M_{13}$, and $M_{14}$ vary by specific gradation is given from, for example, the productional point of view, etc., the gate capacitances of the transistor patterns are represented by, from the left, Cox+ΔCox, Cox+2ΔCox, Cox+3ΔCox, Cox+4ΔCox, Cox+5ΔCox, Cox+6ΔCox, Cox+7ΔCox, and Cox+8ΔCox. In this case, the respective drain currents of the transistor patterns can be represented by:

$I_{DM11}=\mu n(Cox+\Delta Cox)(W/L)[(Vo1-V_T)-\frac{1}{2}V_{DS1}]V_{DS1}$;

$I_{DM12}=\mu n(Cox+2\Delta Cox)(W/L)[(Vo2-V_T)-\frac{1}{2}V_{DS1}]V_{DS1}$;

$I_{DM21}=\mu n(Cox+3\Delta Cox)(W/L)[(Vob2-V_T)-\frac{1}{2}V_{DS2}]V_{DS2}$;

$I_{DM22}=\mu n(Cox+4\Delta Cox)(W/L)[(Vob1-V_T)-\frac{1}{2}V_{DS2}]V_{DS2}$;

$I_{DM23}=\mu n(Cox+5\Delta Cox)(W/L)[(Vob1-V_T)-\frac{1}{2}V_{DS2}]V_{DS2}$;

$I_{DM24}=\mu n(Cox+6\Delta Cox)(W/L)[(Vob2-V_T)-\frac{1}{2}V_{DS2}]V_{DS2}$;

$I_{DM13}=\mu n(Cox+7\Delta Cox)(W/L)[(Vo2-V_T)-\frac{1}{2}V_{DS1}]V_{DS1}$;

and $I_{DM14}=\mu n(Cox+8\Delta Cox)(W/L)[(Vo1-V_T)-\frac{1}{2}V_{DS1}]V_{DS1}$.

In this case, when Vo1=Vob2, and Vo2=Vob1 (i.e., when the threshold voltage of the comparator circuit 200 is a central value between the voltages Vt1 and Vt2 in FIG. 4), drain currents $I_{DS1}$ of the NMOS transistors m11 and m12 and drain currents $I_{DS2}$ of the NMOS transistors m13 and m14 can be respectively represented by the following expressions:

$I_{DS1}=I_{DM11}+I_{DM12}+I_{DM13}+I_{DM14}=\mu n(Cox+18\Delta Cox)(W/L)[(Vo1-V_T)-\frac{1}{2}V_{DS1}]V_{DS1}$; and $I_{DS2}=I_{DM21}+I_{DM22}+I_{DM23}+I_{DM24}=\mu n(Cox+18\Delta Cox)(W/L)[(Vo2-V_T)-\frac{1}{2}V_{DS2}]V_{DS2}$.

Therefore, even in the case where the gate capacitances of the transistor patterns $M_{11}$, $M_{12}$, $M_{21}$, $M_{22}$, $M_{23}$, $M_{24}$, $M_{13}$, and $M_{14}$ vary by specific gradation, the influence thereof can be cancelled.

Further, by allowing the NMOS transistors m11 and m12 to share a drain (i.e., connecting the NMOS transistors m11 and m12 via a common node) and allowing the NMOS transistors m13 and m14 to share a drain (i.e., connecting the NMOS transistors m13 and m14 via a common node), the respective gate-drain capacitances of the NMOS transistors m11, m12, m13 and m14 can be reduced, and therefore it is possible to control the influence of kickback noise on the comparator circuit 200.

(Embodiment 5)

As Embodiment 5 of the present invention, a system using an A/D converter according to the present invention is now described.

Figure 9:
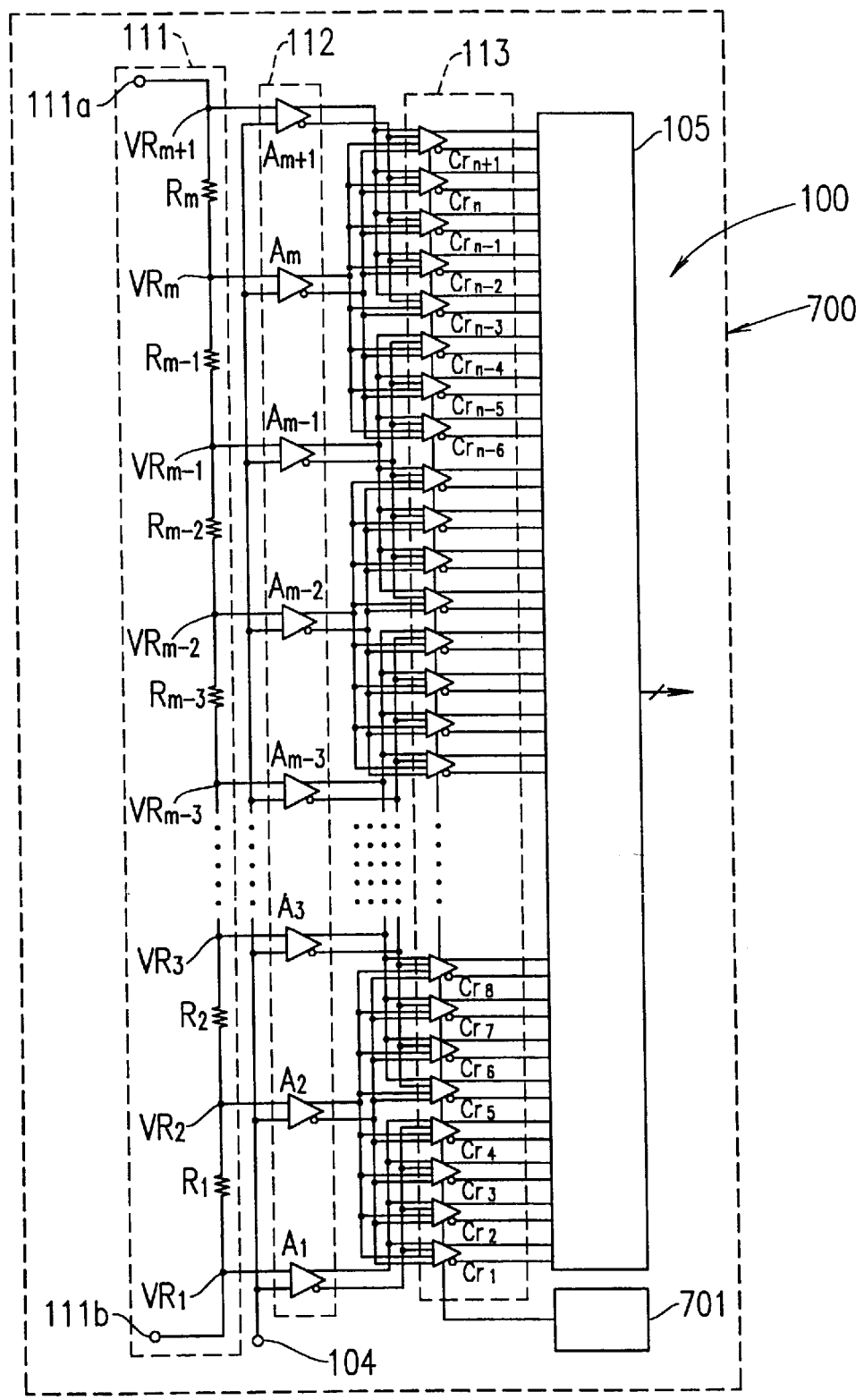
FIG. 9 is a diagram showing a system using an A/D converter according to the present invention.
Figure 10:
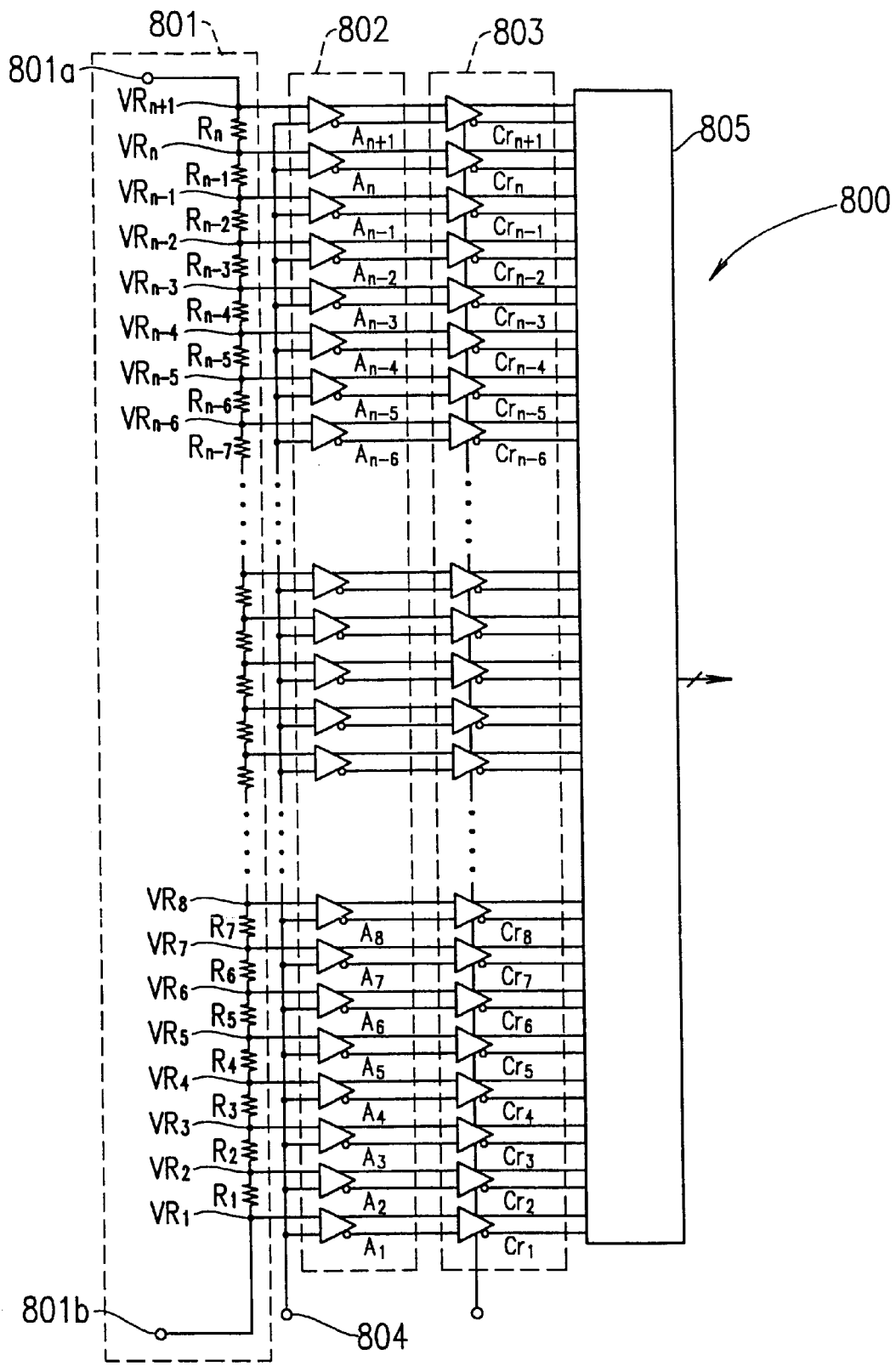
FIG. 10 is a diagram showing a structure of a conventional parallel-type A/D converter.
Figure 11:
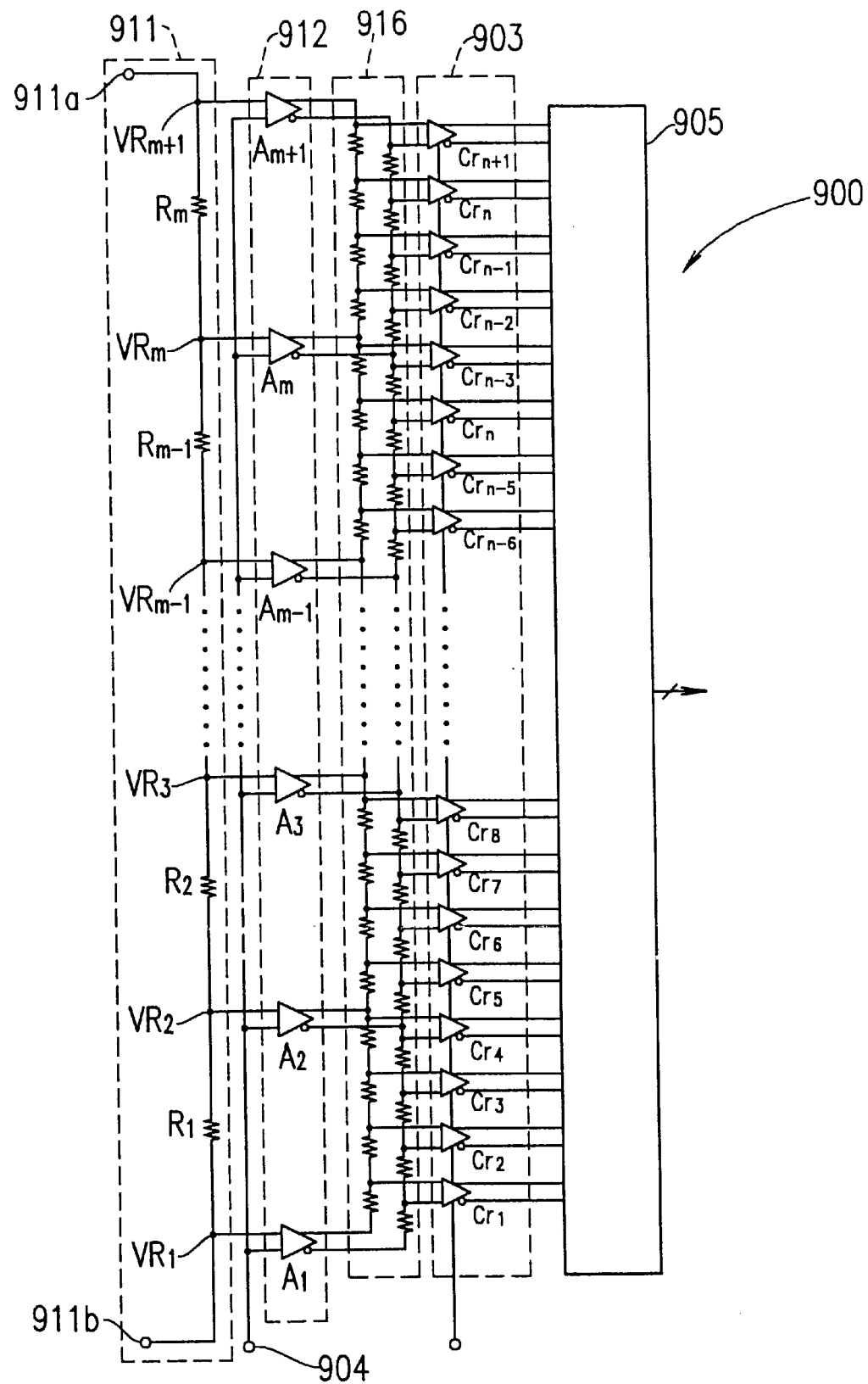
FIG. 11 is a diagram showing a structure of an improved conventional parallel-type A/D converter.
Figure 12:
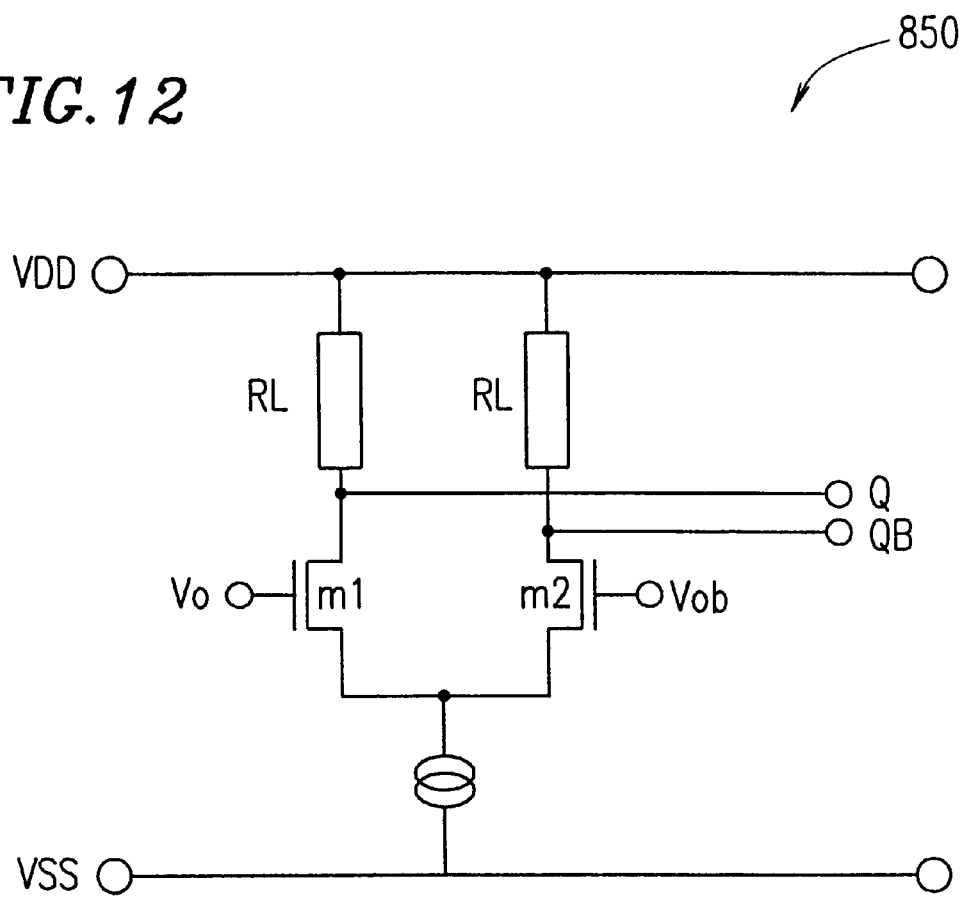
FIG. 12 is a circuit diagram showing a comparator circuit used in a conventional A/D converter.

FIG. 9 is a diagram showing a system 700 using an A/D converter according to the present invention. The system 700 includes a clock signal generator circuit (clock signal generation section) 701 for generating a clock signal having a variable frequency, and an A/D converter 100 to which the clock signal generator circuit 701 is connected. As shown in FIG. 9, the A/D converter used in Embodiment 5 of the present invention is the same as the A/D converter 100 according to Embodiment 1 of the present invention. However, the present invention is not limited to this, and any A/D converter according to the other embodiments of the present invention can be used in Embodiment 5 so long as such an A/D converter has a feature of the present invention.

In the system 700 according to Embodiment 5, the clock signal generator circuit 701 for generating a clock signal having a variable frequency is connected to the A/D converter 100 and a time period in which no operating current flows is increased when the clock frequency is low. Therefore it is possible to keep low power consumption. For example, the system of the present invention is particularly useful as a system including a DVD/CD reproducing/ recording apparatus which switches reproduction speed.

Further, the system according to the present invention uses an A/D converter having a small area, and thus can be constructed so as to be compact.

According to the present invention, an operating section includes a comparison section having a threshold voltage Vtn, the comparison section includes an input transistor section to which first and second output voltage sets of the plurality of output voltage sets are input and a positive-feedback section which is operated according to the clock signal, the first output voltage set includes a first non-inverted output voltage and a first inverted output voltage, the second output voltage set includes a second non-inverted output voltage and a second inverted output voltage, the input transistor section performs a prescribed weighting calculation so as to determine the threshold voltage Vtn and compares a difference between the first non-inverted output voltage and the first inverted output voltage with a difference between the second non-inverted output voltage and the second inverted output voltage so as to output a comparison result to the positive-feedback section, and the positive-feedback section amplifies the comparison result output by the input transistor section when the clock signal is at a prescribed level and retains the amplified comparison result while outputting the amplified comparison result as a digital signal. No operating current flows into the comparison section after the comparison results are amplified to VDD and VSS levels. Moreover, the positive-feedback section is not operated when the clock signal is not at a prescribed level, and thus no operating current flows into the comparison section. Therefore, it is possible to realize a low-power consuming A/D converter. Further, an interpolation circuit, such as a resistor array, is not required, and therefore it is possible to further reduce power consumption and an area occupied by circuit elements.

The A/D converter according to the present invention further includes a first interpolation section for interpolating first and second non-inverted output voltages and a second interpolation section for interpolating first and second inverted output voltages, and therefore it is possible to further reduce the number of differential amplifiers.

The A/D converter according to the present invention further includes an input signal voltage level detection section for controlling the operating section according to the level of the input signal voltage, and therefore only the comparator circuits included in the operating circuit, which are required to be operated, are operated according to the voltage level of analog signals and the operation of the other non-required comparator circuits is caused to stop, and therefore it is possible to significantly reduce the power consumption.

Furthermore, the input transistor section includes a plurality of transistors and the weighting calculation is performed by changing the respective sizes of the plurality of transistors, and therefore an interpolation circuit, such as a resistor array, is not required, so that it is possible to further reduce the power consumption and an area occupied by the circuit elements.

Further still, the operating section includes $2^n$ comparison sections, where n is an integer, and therefore it is possible to realize an A/D converter having a resolving power which is improved by an amount in proportion to the number of increased comparison sections.

Further still, the plurality of transistors are provided so as to form respective prescribed transistor patterns and dummy transistor patterns are provided at opposite ends of a series of the transistor patterns, and therefore the precision of gate patterns is maintained.

Further still, the series of the transistor patterns is linearly-symmetrical with respect to a center line of the input transistor section, and therefore it is possible to control unevenness in transistor characteristics, such as a mismatch between the transistor characteristics.

Further still, the A/D converter according to the present invention can be formed on a single chip, and therefore it is possible to enhance the effect of reducing an area occupied by the circuit elements.

Further still, the system according to the present invention includes an A/D converter and a clock signal generation section. When the clock frequency is low, a time period in which no operating current flows is increased, and therefore it is possible to keep low power consumption. Moreover, the system according to the present invention uses an A/D converter having a small area, and thus can be constructed so as to be compact.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An A/D converter comprising:
    a reference voltage generation section for generating a plurality of reference voltages;
    a differential amplification section for amplifying a voltage difference between each of the plurality of reference voltages and an input signal voltage so as to generate a plurality of output voltage sets, each of the plurality of output voltage sets including complementary non-inverted and inverted output voltages; and
    an operating section for receiving the plurality of output voltage sets, the operating section being operated according to a clock signal,
    wherein the operating section includes a comparison section having a threshold voltage Vtn,
    the comparison section includes an input transistor section to which first and second output voltage sets of the plurality of output voltage sets are input, and a positive-feedback section operating according to the clock signal,
    the first output voltage set includes a first non-inverted output voltage and a first inverted output voltage, and the second output voltage set includes a second non-inverted output voltage and a second inverted output voltage,
    the input transistor section performs a prescribed weighting calculation so as to determine the threshold voltage Vtn, and compares a difference between the first non-inverted output voltage and the first inverted output voltage with a difference between the second non-inverted output voltage and the second inverted output voltage so as to output a comparison result to the positive-feedback section, and
    the positive-feedback section amplifies the comparison result output by the input transistor section when the clock signal is at a prescribed level and retains the amplified comparison result while outputting the amplified comparison result as a digital signal.

2. An A/D converter according to claim 1, further comprising an encoding section for encoding the digital signal.

3. An A/D converter according to claim 1, further comprising a first interpolation section for interpolating the first and second non-inverting output voltages and a second interpolation section for interpolating the first and second inverted output voltages.

4. An A/D converter according to claim 1, further comprising an input signal voltage level detection section for detecting the input signal voltage so as to control the operating section according to a level of the input signal voltage.

5. An A/D converter according to claim 1, wherein the input transistor section includes a plurality of transistors and the weighting calculation is performed by changing respective sizes of the plurality of transistors.

6. An A/D converter according to claim 1, wherein the operating section includes $2^n$ comparison sections, where n is an integer.

7. An A/D converter according to claim 5, wherein the plurality of transistors are provided so as to form respective prescribed transistor patterns, and dummy transistor patterns are provided at opposite ends of a series of the transistor patterns.

8. An A/D converter according to claim 5, wherein the plurality of transistors are provided so as to form respective prescribed transistor patterns, and the series of the transistor patterns is linearly-symmetrical with respect to a center line of the input transistor section.

9. An A/D converter according to claim 1, wherein the reference voltage generation section, the differential amplification section, and the operating section are formed on a single chip.

10. A system comprising:

a clock signal generation section for generating a clock signal having a variable frequency; and an A/D converter to which the clock signal generation section is connected, the A/D converter comprising:

a reference voltage generation section for generating a plurality of reference voltages;

a differential amplification section for amplifying a voltage difference between each of the plurality of reference voltages and an input signal voltage so as to generate a plurality of output voltage sets, each of the plurality of output voltage sets including complementary non-inverted and inverted output voltages; and an operating section for receiving the plurality of output voltage sets, the operating section being operated according to the clock signal, wherein the operating section includes a comparison section having a threshold voltage Vtn, the comparison section includes an input transistor section to which first and second output voltage sets of the plurality of output voltage sets are input, and a positive-feedback section operating according to the clock signal, the first output voltage set includes a first non-inverted output voltage and a first inverted output voltage, and the second output voltage set includes a second non-inverted output voltage and a second inverted output voltage, the input transistor section performs a prescribed weighting calculation so as to determine the threshold voltage Vtn, and compares a difference between the first non-inverted output voltage and the first inverted output voltage with a difference between the second non-inverted output voltage and the second inverted output voltage so as to output a comparison result to the positive-feedback section, and the positive-feedback section amplifies the comparison result output by the input transistor section when the clock signal is at a prescribed level and retains the amplified comparison result while outputting the amplified comparison result as a digital signal.

* * * * *